(12) United States Patent
Zhang et al.

(10) Patent No.: US 11,800,777 B2
(45) Date of Patent: Oct. 24, 2023

(54) ADHESIVE LAYER WITH EMBEDDED PADS FOR FOLDED DISPLAY

(71) Applicants: Chengdu BOE Optoelectronics Technology Co., Ltd., Chengdu (CN); BOE TECHNOLOGY GROUP CO., LTD., Beijing (CN)

(72) Inventors: Na Zhang, Beijing (CN); Bin Zhang, Beijing (CN); Jing Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 239 days.

(21) Appl. No.: 17/329,286

(22) Filed: May 25, 2021

(65) Prior Publication Data

US 2022/0093013 A1   Mar. 24, 2022

(30) Foreign Application Priority Data

Sep. 21, 2020  (CN) .......................... 202010996615.X

(51) Int. Cl.
*H10K 71/00* (2023.01)
*H10K 102/00* (2023.01)

(52) U.S. Cl.
CPC ....... *H10K 71/00* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 2023/0008810 A1* | 1/2023 | Shin | H04M 1/0214 |
| 2023/0027091 A1* | 1/2023 | Min | H10K 50/844 |
| 2023/0076097 A1* | 3/2023 | Song | H10K 77/111 |
| 2023/0081522 A1* | 3/2023 | Park | G06F 1/1652 |

\* cited by examiner

*Primary Examiner* — J. E. Schoenholtz
(74) *Attorney, Agent, or Firm* — XSENSUS LLP

(57) ABSTRACT

The present application relates to a display device. The display device includes a flexible display panel including display and back surfaces in a thickness direction thereof; a supporting back film located on the back surface, and including a bendable area and fixed areas located at opposite sides of the bendable area in a first direction; and an adhesive part located between the fixed area and the back surface, and adhered to the fixed area and the back surface; and a flexible supporting part located between the bendable area and the back surface, and being in contact with the bendable area and the back surface. The flexible supporting part is in direct contact with the back surface of the flexible display panel.

17 Claims, 3 Drawing Sheets

ADHESIVE LAYER WITH EMBEDDED PADS FOR FOLDED DISPLAY

CROSS-REFERENCE TO RELATED APPLICATION

This application is based upon, and claims the benefit of and priority to, Chinese Patent Application No. 202010996615.X, filed on Sep. 21, 2020, the entire contents thereof are incorporated herein by reference.

TECHNICAL FIELD

The present disclosure relates to the field of display technology and, in particular, to a display device.

BACKGROUND

At present, flexible display technology based on low temperature poly-silicon (LTPS) provides the possibility of a foldable display product.

The foldable display product usually includes a flexible display panel and a supporting back film attached to the back surface of the flexible display panel. When the supporting back film is attached to the flexible display panel using an adhesive, some foreign objects will inevitably be brought between the supporting back film and the flexible display panel. When foreign objects exist in the bendable area, mechanical stress is present in the process of repeatedly folding the product and the foreign objects will damage the flexible display panel, causing various defects, such as broken bright spots and dark spots.

It should be noted that the information disclosed in the background section above is only used to enhance the understanding of the background of the present disclosure and therefore, may include information that does not constitute prior art known to those skilled in the art.

SUMMARY

The present disclosure provides a display device. The display device includes:

a flexible display panel, including a display surface and a back surface arranged oppositely in a thickness direction of the flexible display panel;

a supporting back film, located on the back surface of the flexible display panel, and including a bendable area and fixed areas, the fixed areas being located at opposite sides of the bendable area in a first direction, and the first direction being perpendicular to the thickness direction; and an adhesive part, located between the fixed area of the supporting back film and the back surface of the flexible display panel, and adhered to the fixed area of the supporting back film and the back surface of the flexible display panel; and a flexible supporting part, located between the bendable area of the supporting back film and the back surface of the flexible display panel, and being in contact with the bendable area of the supporting back film and the back surface of the flexible display panel, wherein the flexible supporting part is in direct contact with the back surface of the flexible display panel.

In an exemplary embodiment of the present disclosure, the flexible supporting part is adhered to the bendable area of the supporting back film by adhesive.

In an exemplary embodiment of the present disclosure, the adhesive part includes a material of optical clear adhesive, and the flexible supporting part includes a material of silica gel.

In an exemplary embodiment of the present disclosure, a rigidity of the supporting back film in the fixed area is greater than that of the supporting back film in the bendable area.

In an exemplary embodiment of the present disclosure, the fixed area and the bendable area of the supporting back film are formed of a same material, and are patterned differently.

In an exemplary embodiment of the present disclosure, the bendable area of the supporting back film is patterned to be provided with a plurality of first hollow holes.

In an exemplary embodiment of the present disclosure, a part of the flexible supporting part is embedded in the first hollow hole.

In an exemplary embodiment of the present disclosure, the plurality of first hollow holes are divided into a plurality of hollow groups arranged along the first direction, each of the hollow groups includes multiple first hollow holes spaced apart from each other in a second direction, and the second direction is perpendicular to the first direction and the thickness direction.

In an exemplary embodiment of the present disclosure, the first hollow holes of the hollow groups adjacent to each other are arranged in a staggered manner.

In an exemplary embodiment of the present disclosure, the first hollow hole is a slotted hole, and a length direction of the slotted hole is the second direction.

In an exemplary embodiment of the present disclosure, the fixed area of the supporting back film is not patterned.

In an exemplary embodiment of the present disclosure, the fixed area of the supporting back film is patterned to be provided with a plurality of second hollow holes, and at least one of a hole density and a hole size of the second hollow hole in the fixed area are is smaller than that of the first hollow hole in the bendable area.

In an exemplary embodiment of the present disclosure, the fixed area and the bendable area of the supporting back film are formed of different materials.

In an exemplary embodiment of the present disclosure, the display device further includes a polarizer and a cover plate, the polarizer is located on the display surface of the flexible display panel, and the cover plate is located on a surface of the polarizer away from the flexible display panel.

In an exemplary embodiment of the present disclosure, the cover plate includes a flexible cover plate and a glass cover plate.

In an exemplary embodiment of the present disclosure, an outer contour of the cover plate exceeds outer contours of the polarizer, the flexible display panel and the supporting back film.

It should be understood that the above general description and the following detailed description are only exemplary and explanatory, which do not intend to limit the present application.

BRIEF DESCRIPTION OF THE DRAWINGS

The drawings here are incorporated into the specification and constitute a part of the specification, show embodiments that conform to the present application, and are used together with the specification to explain the principle of the present application. Understandably, the drawings in the following description are only some embodiments of the present application. For those skilled in the art, other drawings can be obtained based on these drawings without creative work.

DETAILED DESCRIPTION

Figure 1:
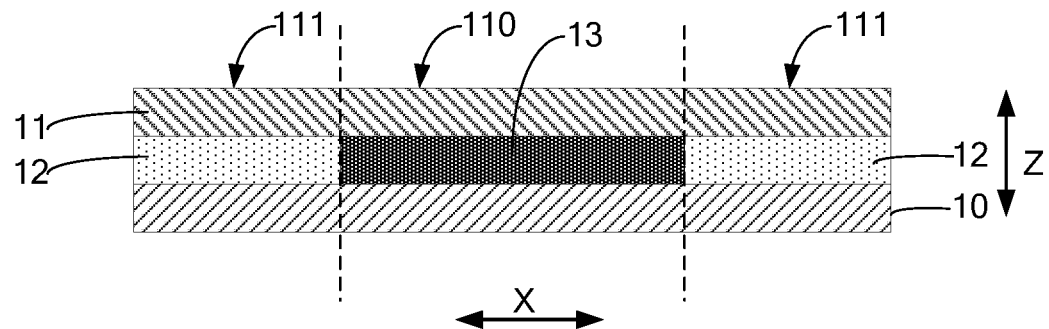
FIG. 1 shows a schematic structural diagram of a display device according to an embodiment of the present disclosure.

In order to make the objectives, technical solutions, and advantages of the present disclosure clearer, the embodiments of the present disclosure will be described in detail below with reference to the accompanying drawings. It should be noted that the embodiment can be implemented in a number of different forms. Those skilled in the art can straightforwardly understand that manner and content can be transformed into various forms without departing from the purpose and scope of the present disclosure. Therefore, the present disclosure should not be interpreted as being limited to the content described in the following embodiments. In the case of no conflict, the embodiments in the present disclosure and the features in the embodiments can be combined with each other arbitrarily.

In the drawings, the size of an element, the thickness of a layer, or the area may be exaggerated for the sake of clarity. Therefore, an implementation of the present disclosure is not necessarily limited to such size, and the shape and size of each component in the drawings do not reflect the true ratio. In addition, the drawings schematically show ideal examples, and an implementation of the present disclosure is not limited to the shapes, numerical values, and the like shown in the drawings.

It shall be noted that the term "on" herein can mean that a layer is directly formed or arranged on another layer, or that a layer is indirectly formed or arranged on another layer with other layer therebetween.

The terms "a/an", "the", and "this" are used to indicate the presence of one or more elements/components/etc. The term "including" is used to mean open-ended inclusion and means that there may be other elements, components, and the like in addition to the listed elements, components, and the like.

The ordinal numbers such as "first" and "second" in the specification are used to avoid the confusion of the constituent elements, rather than limiting quantity.

In the specification, unless otherwise clearly specified and defined, the term "connected" should be interpreted in a broad sense. For example, it may be a fixed connection, or a detachable connection, or an integral connection; it can be a mechanical connection or an electrical connection; it can be a direct connection, or an indirect connection through an intermediate member, or internal communication between two components. For those skilled in the art, the specific meanings of the above-mentioned terms in the present disclosure can be understood according to specific situations.

As shown in FIG. 1, an embodiment of the present disclosure provides a display device 1. The display device 1 may include a flexible display panel 10, a supporting back film 11, an adhesive part 12, and a flexible supporting part 13.

In an embodiment of the present disclosure, the flexible display panel 10 may include a display surface and a back surface arranged oppositely in a thickness direction thereof. In an embodiment of the present disclosure, the flexible display panel 10 may be subjected to various processes, such as bending and folding. For example, the flexible display panel 10 may be an organic light-emitting diode (OELD) display panel; however, the present disclosure is not limited thereto.

The supporting back film 11 may be located on the back surface of the flexible display panel 10 to provide a support for the flexible display panel 10, thereby improving the flatness of the flexible display panel 10 and enhancing the impact resistance and bending resistance of the flexible display panel 10, and thus, improving the reliability and stability of the product. For example, in order to realize supporting performance, the supporting back film 11 may be made of a material with a certain thickness and rigidity, for example, a metal material such as stainless steel (SUS). However, the present disclosure is not limited thereto, and other materials are also applicable.

Specifically, as shown in FIG. 1, the supporting back film 11 may include a bendable area 110 and fixed areas 111 located at opposite sides of the bendable area 110 in a first direction X, and the first direction X is perpendicular to the thickness direction Z of the flexible display panel 10. It should be understood that the bendable area 110 of the supporting back film 11 may correspond to the bendable area 110 of the flexible display panel 10, and when the bendable area 110 of the flexible display panel 10 is bent, the bendable area 110 of the supporting back film 11 is also bent along with the bendable area 110 of the flexible display panel 10. The fixed area 111 of the supporting back film 11 may correspond to the fixed area 111 of the flexible display panel 10. When the flexible display panel 10 on which the supporting back film 11 is mounted is bent, the fixed area 111 (including the fixed area 111 of the flexible display panel 10 and the fixed area 111 of the supporting back film 11) is to be clamped, and then the bendable area 110 is bent.

In an embodiment, in order to improve the bendable performance of the bendable area 110 in the supporting back film 11 to realize a smaller bending radius, the bendable area 110 may be designed to have a small rigidity. The rigidity herein refers to anti-deforming ability. At the same time, in order to ensure the supporting stability of the supporting back film 11 and the overall structural stability of the supporting back film 11, and to reduce processing deformation, the fixed area 111 may be designed to have a large rigidity. That is, the rigidity of the fixed area 111 may be greater than the rigidity of the bendable area 110 in the supporting back film 11 according to an embodiment of the present disclosure.

It shall be noted that the entire supporting back film 11 is usually made of a same metal material, that is, the materials of the fixed area 111 and the bendable area 110 in the supporting back film 11 may be the same. Therefore, in order to make the rigidity of the fixed area 111 different from that of the bendable area 110, the fixed area 111 and the bendable area 110 may be patterned differently to have different rigidities. However, it shall be understood that in the supporting back film 11 according to an embodiment of the present present disclosure, the bendable area 110 and the fixed area 111 may also be made of materials with different rigidities.

In order for the bendable area 110 to have a smaller rigidity and thus, have an improved bending performance, the entire bendable area 110 may be patterned with holes. That is, as shown in FIG. 4, the bendable area 110 of the supporting back film 11 may be provided with a plurality of hollow holes 110*a*.

Figure 4:
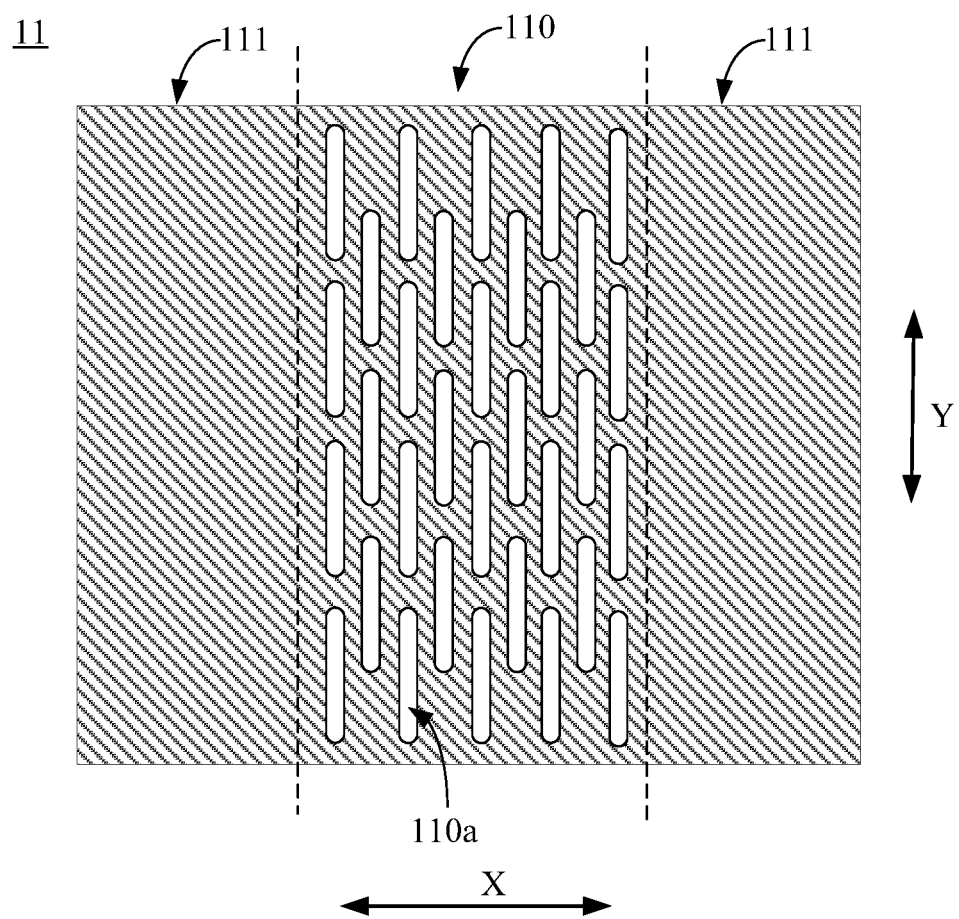
FIG. 4 shows a schematic diagram of the structure of the back film shown in FIG. 2.

In an embodiment, as shown in FIG. 4, the plurality of hollow holes 110*a* may be divided into a plurality of hollow groups arranged along the first direction X, and each of the hollow groups may include multiple hollow holes 110*a* spaced apart from each other in a second direction Y. The second direction Y herein is perpendicular to the first direction X and the thickness direction Z of the flexible display panel 10. It should be understood that according to an embodiment of the present disclosure, the bending axis of the bendable area 110 may be the second direction Y. Therefore, the bending performance of the bendable area 110 may be further improved by arranging the plurality of hollow holes 110 spaced apart from each other in the second direction Y.

Furthermore, as shown in FIG. 4, the hollow holes 110*a* of adjacent hollow groups may be arranged in a staggered manner, and such design may balance the stress at various positions of the bendable area 110, which can avoid damage to the supporting back film 11 due to stress concentration.

For example, the hollow hole 110*a* may be a slotted hole according to an embodiment of the present disclosure. Specifically, as shown in FIG. 4, a length direction of the hollow hole 110*a* may be the above second direction Y, the opposite ends of the hollow hole 110*a* in the length direction are semicircular, and the two sides of the hollow hole 110*a* in the first direction X are straight line. The slotting hole design of the hollow hole 110*a* may improve the bending performance of the bendable area 110 and avoid the stress concentration on the opposite sides of the hollow hole 110*a* in the length direction, thereby improving the structural stability of the supporting back film 11. However, the present disclosure is not limited thereto, and the hollow hole 110*a* may also have other shapes, such as a circle, an ellipse, "I" shape or the like.

It shall be noted that in order to ensure that the rigidity of the fixed area 111 in the supporting back film 11 is greater than the rigidity of the bendable area 110 thereof, the fixed area 111 may not be patterned with holes. However, the present disclosure is not limited thereto, and the fixed area 111 may also be patterned with holes, as long as the hole density and hole size of the fixed area 111 are smaller than that of the bendable area 110, which can ensure the overall supporting performance of the supporting back film 11, and at the same time, avoid damage of the connection position between the bendable area 110 and the fixed area 111 due to excessive stress change.

As shown in FIG. 1, the adhesive part 12 may be located between the fixed area 111 of the supporting back film 11 and the back surface of the flexible display panel 10, and adhered to the fixed area 111 of the supporting back film 11 and the back surface of the flexible display panel 10, so as to bond the supporting back film 11 and the flexible display panel 10. For example, the adhesive part 12 may be an optical clear adhesive (OCA) to improve the bonding stability of the supporting back film 11 and the flexible display panel 10. However, the present disclosure is not limited thereto, and other adhesive materials may also applicable, as long as the stable bond between the supporting back film 11 and the flexible display panel 10 can be ensured.

As shown in FIG. 1, the flexible supporting part 13 may be located between the bendable area 110 of the supporting back film 11 and the back surface of the flexible display panel 10, and be in contact with the bendable area 110 of the supporting back film 11 and the back surface of the flexible display panel 10. The flexible supporting part 13 may support the flexible display panel 10 and the supporting back film 11, so that the folded product may be restored to the original state when being unfolded. The adhesiveness of the flexible supporting part 13 may be lower than that of the adhesive part 12, or the flexible supporting part 13 has no adhesiveness, which design may facilitate efficient cleaning of the flexible supporting part 13, so as to alleviate or avoid foreign matter from being sticked to the surface of the flexible supporting part 13 facing the flexible display panel 10, thereby alleviating or avoiding the foreign matter from being brought between the bendable area 110 of the supporting back film 11 and the flexible display panel 10, and thus alleviating or avoiding the defects such as broken bright spots and dark spots caused by that the foreign objects damages the flexible display panel 10 in the repeated folding process, which can improve product quality.

In an embodiment, the entire flexible supporting part 13 may have no adhesiveness. Specifically, the flexible supporting part 13 may be in direct contact with the back surface of the flexible display panel 10, that is, the flexible supporting part 13 is not adhered to the flexible display panel 10. Since there is no adhesion between the flexible supporting part 13 and the back surface of the flexible display panel 10, in order to avoid the flexible supporting part 13 from being misaligned after repeated bending, the surface of the flexible supporting part 13 contacting the bendable area 110 of the supporting back film 11 may be provided with adhesive, that is, the flexible supporting part 13 may be adhered to the bendable area 110 of the supporting back film 11 by the adhesive. The adhesive may be optical clear adhesive and the like. However, the present disclosure is not limited thereto, and other adhesive materials may be applicable, as long as a stable bonding between the flexible supporting part 13 and the supporting back film 11 can be ensured.

For example, in an embodiment of the present disclosure, the material of the flexible supporting part 13 may be silica gel, so as to ensure a good bending performance and at the same time, a good supporting performance, so that the folded product can be restored to the original state thereof when being unfolded. However, the present disclosure is not limited thereto, the material of the flexible supporting part 13 may also be foam, rubber and other materials, which depends on the specific circumstances.

Figure 2:
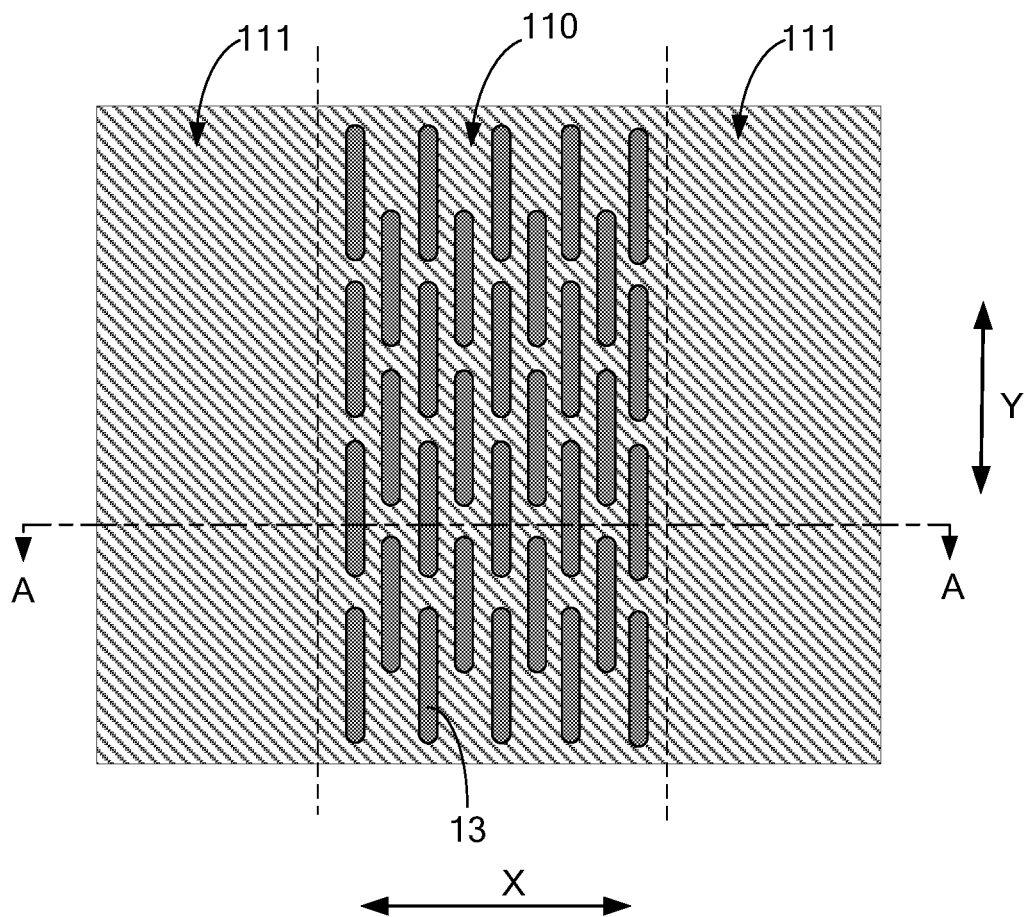
FIG. 2 shows a schematic top view of a supporting back film and a flexible supporting part after being assembled in a display device according to an embodiment of the present disclosure.
Figure 3:
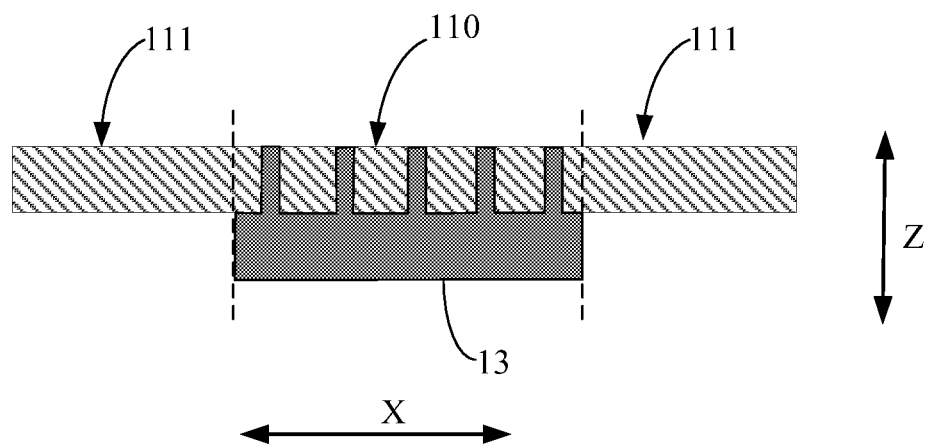
FIG. 3 shows a schematic cross-sectional view of the structure shown in FIG. 2 taken along the line A-A.

When the aforementioned hollow hole 110*a* is provided in the bendable area 110 of the supporting back film 11, as shown in FIGS. 2 and 3, a part of the flexible supporting part 13 may be embedded in the hollow hole 110*a*, which design can increase the contact area between the flexible supporting part 13 and the supporting back film 11, and thus can increase the friction between the flexible supporting part 13 and the supporting back film 11, so as to further avoid the misalignment of the flexible supporting part 13 after repeated bending and ensure the bonding stability between the flexible supporting part 13 and the supporting back film 11. In an embodiment of the present disclosure, the process of attaching the supporting back film 11 to the flexible supporting part 13 may specifically include: adhering the flexible supporting part 13 to the bendable area 110 of the supporting back film 11; then forming the adhesive part 12 in the fixed area 111 of the supporting back film 11; then adhering the adhesive part 12 to the back surface of the flexible display panel 10, so that the entire supporting back film 11 is attached to the back surface of the flexible supporting part 13. The adhesive part 12 is adhered to the back surface of the flexible display panel 10, and the flexible supporting part 13 may be in contact with the back surface of the flexible display panel 10.

It shall be noted that after the flexible supporting part 13 is adhered to the bendable area 110 of the supporting back film 11, and before the adhesive part 12 is adhered to the back surface of the flexible display panel 10, the flexible supporting part 13 may be cleaned to prevent foreign matter from being brought between the bendable area 110 of the supporting back film 11 and the flexible display panel 10, thereby alleviating or avoiding the defects such as broken bright spots and dark spots caused by that the foreign objects damages the flexible display panel 10 in the repeated folding process, which can improve product quality.

Figure 5:
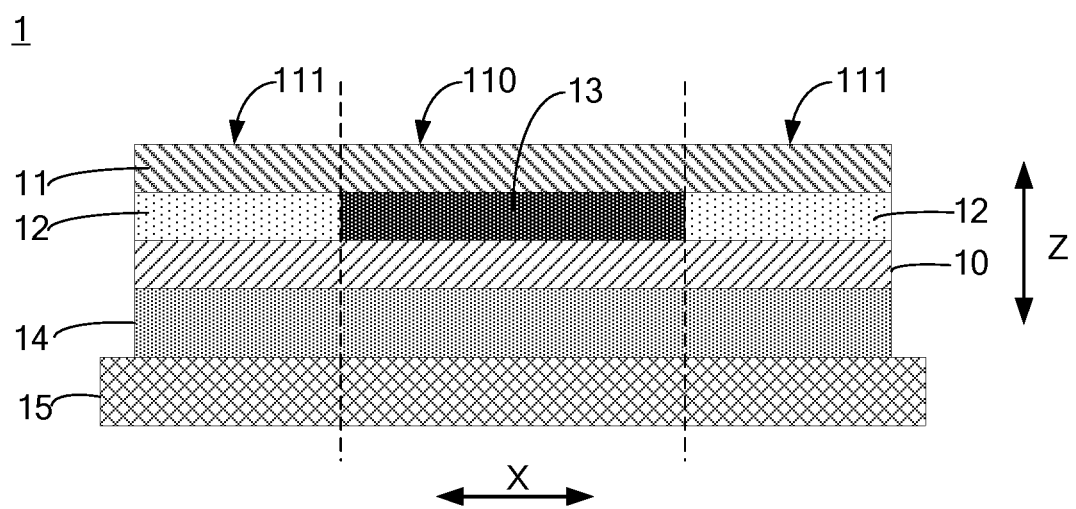
FIG. 5 shows a schematic structural diagram of a display device according to another embodiment of the present disclosure.

In some embodiments, as shown in FIG. 5, the display device 1 may further include a polarizer 14 and a cover plate 15. The polarizer 14 is located on the display surface of the flexible display panel 10, and the cover plate 15 may be located on a surface of the polarizer 14 away from the flexible display panel 10.

For example, when the flexible display panel 10 in the embodiment of the present disclosure is an OLED display, the polarizer 14 may be a circular polarizer 14, which has a high reflectivity to external ambient light, so as to reduce the overall reflectivity of the display device 1, thereby improving the display effect.

The cover plate 15 may be a flexible cover plate 15. For example, the cover plate 15 may be made of polyimide (PI) and the like, so that the cover plate 15 has bending and folding performances, and may be bent along with the flexible display panel 10 and the supporting back film 11. However, the present disclosure is not limited thereto, and the cover plate 15 may also be a glass cover plate 15 or the like.

The outer contour of the cover plate 15 may exceed the outer contours of the polarizer 14, the flexible display panel 10 and the supporting back film 11, so that the cover plate 15 may be mounted on the middle frame. However, the present disclosure is not limited thereto, the outer contour of the cover plate 15 may also coincide with the outer contours of the polarizer 14, the flexible display panel 10 and the supporting back film 11, which depends on the specific circumstances.

It shall be noted that according to an embodiment of the present disclosure, the display device 1 may be a foldable display product, which may be of inward fold or outward fold. The inward fold here means that the display surface is at the inner side after being folded, and the outward fold here means that the display surface is at the outer side after being folded.

In an embodiment of the present disclosure, the specific type of the display device 1 is not particularly limited, and any type of display device 1 commonly used in the field can be used, such as TV, mobile phone, computer, watch, in-vehicle device, medical device and the like. Those skilled in the art may make a corresponding selection according to the specific purpose of the display device 1, which will not be repeated here.

It shall be noted that, in addition to the aforementioned structure, the display device 1 also includes other necessary parts and components. By taking TV as an example, it may further specifically include for example a housing, a circuit board, a power in the like. Those skilled in the art may make a corresponding addition according to the specific purpose of the display device 1, which will not be repeated here.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include the common knowledge or customary technical means in the technical field that are not disclosed in the present disclosure. The description and embodiments are only regarded as exemplary, and the true scope and spirit of the present disclosure are limited by the appended claims.

What is claimed is:

1. A display device, comprising:
 a flexible display panel comprising a display surface and a back surface arranged oppositely in a thickness direction of the flexible display panel;
 a supporting back film located on the back surface of the flexible display panel, and comprising a bendable area and fixed areas, the fixed areas being located at opposite sides of the bendable area in a first direction, and the first direction being perpendicular to the thickness direction;
 an adhesive part located between the fixed area of the supporting back film and the back surface of the flexible display panel, and adhered to the fixed area of the supporting back film and the back surface of the flexible display panel; and
 a flexible supporting part located between the bendable area of the supporting back film and the back surface of the flexible display panel, and being in contact with the bendable area of the supporting back film and the back surface of the flexible display panel,
 wherein the flexible supporting part is in direct contact with the back surface of the flexible display panel.

2. The display device according to claim 1, wherein the flexible supporting part is adhered to the bendable area of the supporting back film by adhesive.

3. The display device according to claim 2, wherein the adhesive part comprises a material of optical clear adhesive, and the flexible supporting part comprises a material of silica gel.

4. The display device according to claim 1, wherein a rigidity of the supporting back film in the fixed area is greater than that of the supporting back film in the bendable area.

5. The display device according to claim 4, wherein the fixed area and the bendable area of the supporting back film are formed of a same material, and are patterned differently.

6. The display device according to claim 4, wherein the bendable area of the supporting back film is patterned to be provided with a plurality of first hollow holes.

7. The display device according to claim 6, wherein a part of the flexible supporting part is embedded in the first hollow hole.

8. The display device according to claim 6, wherein the plurality of first hollow holes are divided into a plurality of hollow groups arranged along the first direction, each of the hollow groups comprises multiple first hollow holes spaced apart from each other in a second direction, and the second direction is perpendicular to the first direction and the thickness direction.

9. The display device according to claim 8, wherein the first hollow holes of the hollow groups adjacent to each other are arranged in a staggered manner.

10. The display device according to claim 8, wherein the first hollow hole is a slotted hole, and a length direction of the slotted hole is the second direction.

11. The display device according to claim 6, wherein the fixed area of the supporting back film is not patterned.

12. The display device according to claim 6, wherein the fixed area of the supporting back film is patterned to be provided with a plurality of second hollow holes, and at least one of a hole density and a hole size of the second hollow hole in the fixed area is smaller than that of the first hollow hole in the bendable area.

13. The display device according to claim 4, wherein the fixed area and the bendable area of the supporting back film are formed of different materials.

14. The display device according to claim 1, further comprising a polarizer and a cover plate,
   wherein the polarizer is located on the display surface of the flexible display panel, and the cover plate is located on a surface of the polarizer away from the flexible display panel.

15. The display device according to claim 14, wherein the cover plate comprises a flexible cover plate and a glass cover plate.

16. The display device according to claim 14, wherein an outer contour of the cover plate exceeds outer contours of the polarizer, the flexible display panel and the supporting back film.

17. A method, comprising:
providing a display device, comprising:
   a flexible display panel comprising a display surface and a back surface arranged oppositely in a thickness direction of the flexible display panel;
   a supporting back film located on the back surface of the flexible display panel, and comprising a bendable area and fixed areas, the fixed areas being located at opposite sides of the bendable area in a first direction, and the first direction being perpendicular to the thickness direction;
   an adhesive part located between the fixed area of the supporting back film and the back surface of the flexible display panel, and adhered to the fixed area of the supporting back film and the back surface of the flexible display panel; and
   a flexible supporting part located between the bendable area of the supporting back film and the back surface of the flexible display panel, and being in contact with the bendable area of the supporting back film and the back surface of the flexible display panel,
wherein the flexible supporting part is in direct contact with the back surface of the flexible display panel.

* * * * *